(12) United States Patent
Sundar et al.

(10) Patent No.: US 7,319,709 B2
(45) Date of Patent: Jan. 15, 2008

(54) CREATING PHOTON ATOMS

(75) Inventors: Vikram C. Sundar, Stoneham, MA (US); Moungi G. Bawendi, Boston, MA (US); John D. Joannopoulos, Belmont, MA (US); Mihai Ibanescu, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 865 days.

(21) Appl. No.: 10/200,582

(22) Filed: Jul. 23, 2002

(65) Prior Publication Data

US 2004/0017834 A1  Jan. 29, 2004

(51) Int. Cl.
*H01S 3/14* (2006.01)
(52) U.S. Cl. .......................... 372/39; 372/64
(58) Field of Classification Search ................. 372/69, 372/6; 385/127
See application file for complete search history.

(56) References Cited

U.S. PATENT DOCUMENTS

| | | | |
|---|---|---|---|
| 4,599,380 A * | 7/1986 | Ueda et al. ..................... 525/68 |
| 4,884,860 A * | 12/1989 | Brown .......................... 385/27 |
| 4,999,285 A * | 3/1991 | Stiso ........................... 435/7.9 |
| 5,029,976 A * | 7/1991 | Goto ........................... 359/328 |
| 5,187,461 A | 2/1993 | Brommer et al. |
| 5,260,957 A | 11/1993 | Hakimi et al. |
| 5,262,357 A | 11/1993 | Alivisatos et al. |
| 5,293,050 A | 3/1994 | Chapple-Sokol et al. |
| 5,354,707 A | 10/1994 | Chapple-Sokol et al. |
| 5,389,943 A | 2/1995 | Brommer et al. |
| 5,395,791 A | 3/1995 | Cheng et al. |
| 5,406,573 A | 4/1995 | Ozbay et al. |
| 5,422,489 A | 6/1995 | Bhargava |
| 5,440,421 A | 8/1995 | Fan et al. |
| 5,471,180 A | 11/1995 | Brommer et al. |
| 5,492,080 A | 2/1996 | Ohkawa et al. |
| 5,496,597 A * | 3/1996 | Soininen et al. ............ 427/584 |
| 5,499,260 A | 3/1996 | Takahashi et al. |
| 5,505,928 A | 4/1996 | Alivisatos et al. |
| 5,515,393 A | 5/1996 | Okuyama et al. |
| 5,525,377 A | 6/1996 | Gallagher et al. |
| 5,526,449 A | 6/1996 | Meade et al. |
| 5,537,000 A | 7/1996 | Alivisatos |
| 5,541,948 A | 7/1996 | Krupke et al. |
| 5,574,815 A * | 11/1996 | Kneeland .................... 385/101 |
| 5,585,640 A | 12/1996 | Huston et al. |
| 5,600,483 A | 2/1997 | Fan et al. |
| 5,625,456 A | 4/1997 | Lawandy |

(Continued)

FOREIGN PATENT DOCUMENTS

EP          0 646 999          4/1995

(Continued)

OTHER PUBLICATIONS

Alivisatos, "Perspectives on the Physical Chemistry of Semiconductor Nanocrystals", J. Phys. Chem., vol. 100, No. 31, pp. 13226-13239, (1996).

(Continued)

*Primary Examiner*—Dung (Michael) T. Nguyen
(74) *Attorney, Agent, or Firm*—Steptoe & Johnson LLP

(57) ABSTRACT

A narrow linewidth fluorescent emitter can incorporate a chromophore into a microcavity that can support low-order optical modes.

35 Claims, 3 Drawing Sheets

U.S. PATENT DOCUMENTS

| | | | |
|---|---|---|---|
| 5,674,698 | A | 10/1997 | Zarling et al. |
| 5,684,817 | A | 11/1997 | Houdre et al. |
| 5,721,099 | A | 2/1998 | Still et al. |
| 5,736,330 | A | 4/1998 | Fulton |
| 5,747,180 | A | 5/1998 | Miller et al. |
| 5,748,057 | A | 5/1998 | De Los Santos |
| 5,751,018 | A | 5/1998 | Alivisatos et al. |
| 5,815,627 | A * | 9/1998 | Harrington ............... 385/125 |
| 5,818,309 | A | 10/1998 | De Los Santos |
| 5,881,200 | A | 3/1999 | Burt |
| 5,990,479 | A | 11/1999 | Weiss et al. |
| 6,207,229 | B1 | 3/2001 | Bawendi et al. |
| 6,207,392 | B1 * | 3/2001 | Weiss et al. ............... 435/7.1 |
| 6,251,303 | B1 | 6/2001 | Bawendi et al. |
| 6,538,375 | B1 * | 3/2003 | Duggal et al. ............... 313/506 |
| 6,781,690 | B2 * | 8/2004 | Armstrong et al. ......... 356/301 |
| 6,788,862 | B2 * | 9/2004 | Aitken et al. ............... 385/122 |
| 6,816,652 | B1 * | 11/2004 | Lin et al. ................... 385/39 |
| 2001/0028029 | A1 * | 10/2001 | Scalora et al. ............. 250/216 |
| 2002/0172250 | A1 * | 11/2002 | Myers et al. ............... 372/69 |
| 2002/0172484 | A1 * | 11/2002 | Komachi et al. ........... 385/125 |
| 2003/0103709 | A1 * | 6/2003 | Grinberg et al. ............ 385/2 |
| 2003/0123827 | A1 * | 7/2003 | Salerno et al. ............. 385/129 |
| 2003/0180029 | A1 * | 9/2003 | Garito et al. ............... 385/142 |
| 2003/0224214 | A1 * | 12/2003 | Garito et al. ........ 428/694 ML |
| 2004/0071423 | A1 * | 4/2004 | Libori et al. ............... 385/127 |
| 2004/0214001 | A1 * | 10/2004 | Oldenburg et al. ......... 428/404 |
| 2004/0218651 | A1 * | 11/2004 | Iwasaki et al. ............. 372/69 |
| 2005/0117860 | A1 * | 6/2005 | Vienne et al. .............. 385/115 |
| 2006/0127011 | A1 * | 6/2006 | Blauvelt et al. ............. 385/50 |

FOREIGN PATENT DOCUMENTS

| | | |
|---|---|---|
| EP | 1 039 561 | 9/2000 |
| EP | 1 146 614 | 10/2001 |
| JP | 2000-200688 | 7/2000 |
| WO | WO 98/04740 | 2/1998 |
| WO | WO 98/19963 | 5/1998 |
| WO | WO 98/33070 | 7/1998 |
| WO | WO 98/36376 | 8/1998 |
| WO | WO 99/19515 | 4/1999 |
| WO | WO 99/26299 | 6/1999 |
| WO | WO 99/50916 | 10/1999 |
| WO | WO 00/17655 | 3/2000 |
| WO | WO 00/17656 | 3/2000 |
| WO | WO 00/27365 | 5/2000 |
| WO | WO 00/27436 | 5/2000 |
| WO | WO 00/28088 | 5/2000 |
| WO | WO 01/07689 | 2/2001 |
| WO | WO 01/31374 | 5/2001 |
| WO | WO 01/71867 | 9/2001 |

OTHER PUBLICATIONS

Alivisatos, "Semiconductor Clusters, Nanocrystals, and Quantum Dots," Science, 271, pp. 933-937, (1996).

Bawendi, et al,. "Luminescence properties of CdSe quantum crystallites: Resonance between interior and surface localized states", J. Chem. Phys., 96(2), pp. 946-954, (Jan. 1, 1992).

Bayer, M. et al., "Optical Modes in Photonic Molecules," Physical Review Letters, vol. 81, No. 12, pp. 2582-2585, (1998).

Benner, R. E. et al., "Observation of Structure Resonances in the Fluorescence Spectra from Microspheres," Physical Review Letters, vol. 4, No. 7, pp. 475-478, (1980).

Bruchez et al., "Semiconductor nanocrystals as fluorescent probes for biology," Cytometry, Supplement 9, p. 26, (Mar. 1998).

Campillo, A. J. et al., "Cavity Quantum Electrodynamic Enhancement of Stimulated Emission in Microdroplets," Physical Review Letters, vol. 67, No. 4, pp. 437-440, (1991).

Chan, C. T. et al., "Photonic band gaps form metallo-dielectric spheres," Physica B 279, pp. 150-154, (2000).

Colvin et al., "Light-emitting diodes made from cadmium selenide nanocrystals and a semiconducting polymer" Nature, 370(6488):354-357, (Aug. 4, 1994).

Correa-Duarte et al., "Stabilization of CdS semiconductor nanoparticles against photodegradation by a silica coating procedure," Chemical Physics Letters, 286, pp. 497-501 (1998).

Dabbousi et al., "(CdSe)ZnS Core-Shell Quantum Dots: Synthesis and Characterization of a Size Series of Highly Luminescent Nanocrystallites," The Journal of Physical Chemistry B, 101(46), pp. 9463-9475 (1997).

Dabbousi et al., "Electroluminescence from CdSe quantum-dot/polymer composites," Appl. Phys. Lett., 66 (11), pp. 1316-1318, (1995).

Danek et al., "Synthesis of Luminescent Thin-Film CdSeZnSe Quantum Dot Composites Using CdSe Quantum Dots Passivity with an Over layer of ZnS," Chem. Mater., 8(1), pp. 173-180, (1996).

Empedocles, et al., "Photoluminescence Spectroscopy of Single CdSe Nanocrystallite Quantum Dots", Physical Review Letters, vol. 77, No. 18, pp. 3873-3876, (1996).

Empedocles, et al., Quantum-Confined Stark Effect in single CdSe Nanocrystallite Quantum Dots:, Sciente, vol. 278, pp. 2114-2117, (1997).

Gan, et al., "Enhanced Photoluminescence and Characterization of Mn-Doped ZnS Nanocrystallites Synthesized in Microemulsion", American Chemical Society, Langmuir, vol. 13, No. 24, pp. 6427-6431, (1997).

Gao et al., "Strongly Photoluminescent CdTe Nanocrystals by Proper Surface Modification," J. Phys. Chem., vol. 102, pp. 8360-8363, (1998).

Gindele, et al., "Optical gain and high quantum efficiency of matrix-free, closely packed CdSe quantum dots", Appl. Phys. Lett., 71(15), pp. 2181-2183, (Oct. 13, 1997.

Glezer et al., "Three Dimensional Optical Storage Inside Transparent Materials," Optical Letters, vol. 21, No. 24, pp. 2023-2025, (1996).

Green, et al., "Recent advances in the preparation of semiconductors as isolated nanometric particles; new routes to quantum dots", Chem. Commun., pp. 2235-2241, (1999).

Guha et al., "Hybrid organic-inorganic semiconductor-based light-emitting diodes" J. Appl. Phys., 82(8), pp. 4126-4128,( Oct. 15, 1997).

Hanprasopwatana, A. et al., "Titania Coatings on Monodisperse Silica Spheres (Characterization Using 2-Propanol Dehydration and TEM)," Langmuir, vol. 12, No. 13, pp. 3173-3179, (1996).

Hines et al., "Synthesis and Characterization of Strongly Luminescing ZnS-Capped CdSe Nanocrystals," J. Phys. Chem. 100, pp. 468-471 (1996).

Joannopoulos et al., *Photonic Crystals, Molding the Flow of Light*, the entire book, Copyright © by Princeton University Press, (1995).

Jarvis, Jr. et al., "Solution Synthesis and Photoluminescence Studies of SMA Crystallites of Cadmium Telluride," Mat. Res. Soc. Symp. Proc. 272, pp. 227-234 (1992).

Kagan et al., "Electronic Energy Transfer in CdSe Quantum Dot Solids," Physical Review Letters, 76, pp. 1517-1520, (Feb. 26, 1996).

Kagan et al., "Long-range resonance transfer of electronic excitations in close-packed CdSe quantum-dot solids," Physical Review Letters, 54, pp. 8633-8643, (Sep. 15, 1996).

Klimov, et al., "Ultrafast dynamics of inter- and intraband transitions in semiconductor nanocrystals: Implications for quantum-dot lasers", Physical Review B, vol. 60, No. 4, pp. 2177-2180, (Jul. 15, 1999).

Klimov, et al., "Quantization of Multiparticle Auger Rates in Semiconductor Quantum Dots", Science, vol. 287, pp. 1011-1013, (Feb. 11, 2000).

Kuno, et al., "The band edge luminescence of surface modified DcSe nanocrystallites: Probing the luminescing state", J. Chem. Phys. 106(23), pp. 9869-9882, (Jun. 15, 1997).

Leatherdale, et al., "Photoconductivity in CdSe quantum dot solids", vol. 62, No. 4, pp. 2669-2680, (Jul. 15, 2000).

Lee et al., "Surface Derivatization of Nanocrystalline CdSe Semiconductors," Mat. Res. Soc. Symp. Proc. 452, pp. 323-328, (1997).

Lett, D. N., "Color-Coding Quantum Dots Debut With Promising Careers In Clinical Diagnostics Field", BioWorld Today, vol. 9, No. 185, p. 1, (1998).

Liz-Marzán, et al., "Synthesis of Nanosized Gold-Silica Core-Shell Particles," Langmuir 12, pp. 4329-4335, (1996).

Ludolph et at., "Novel single molecule precursor routes for the direct synthesis of highly monodispersed quantum dots of cadmium or zinc sulfide or selenide", Chem. Commun., pp. 1849-1850, (1998).

Malik, et al., "Semiconductor nanoparticles: their properties, synthesis and potential for application", South African Journal of Science, 96, pp. 55-60. (2000).

Michael, et al., "Randomly Ordered Addressable High-Density Optical Sensor Arrays", Analytical Chemistry, vol. 70, No. 7, pp. 1242-1248, (Apr. 7, 1998).

Mikulec et al., "Synthesis of Characterization of Highly Luminescent (CdSe)ZnS Quantum Dots," Materials Research Society Symposium, 452, pp. 359-364, (1997).

Müllenborn et al., "Characterization of Solution-Synthesised CdTe and HgTe," Applied Physics, 56, pp. 317-321, (1993).

Murray et al., "Synthesis and Characterization of Nearly Monodisperse CdE (E=S, Se, Te) Semiconductor Nanocrystallites", J. Am. Chem. Soc., vol. 115, No. 19, pp. 8706-8715, (1993).

Nirmal et al., "Fluorescence intermittency in single cadium selenide nanocrystals", Nature, vol. 383, pp. 802-804, (Oct. 31, 1996).

Nozik et al., "Colloidal Quantum Dots of III-V Semiconductors," MRS Bulletin, 23(2), pp. 24-30 (1998).

Pehnt et al., "Nanoparticle Precursor Route to Low-Temperature Spray Deposition of CdTe Thin Films," Appl. Phys. Lett., 67(15), pp. 2176-2178, (Oct. 9, 1995).

Peng, et al., "Epitaxial Growth of Highly Luminescent CdSe/CdS Core/Shell Nanocrystals with Photostability and Electronic Accessibility," J. Am. Chem. Soc., 119, pp. 7019-7029, (1997).

Reithmaier, J. P. et al., "Size Dependence of Confined Optical Modes in Photonic Quantum Dots," Physical Review Letters, vol. 78, No. 2, pp. 378-381, (1997).

Rogach et al., "Synthesis and characterization of Thiol-Stabilized CdTe Nanocrystals" Ber. Bunsenges. Phys. Chem., 100 (11), pp. 1772-2778, (1996).

Spanhel et al., "Photochemistry of Colloidal Semiconductors. Surface Modification and Stability of Strong Luminescing CdS Particles", J. Am. Chem. Soc., 109 (19), pp. 5649-5655, (1987).

Wen, Weijia et al., "Field Induced Structural Transition of Mesocrystallites," Physical Review Letters, vol. 82, No. 21, pp. 4248-4251, (1999).

* cited by examiner

CREATING PHOTON ATOMS

FEDERALLY SPONSORED RESEARCH OR DEVELOPMENT

This invention was made with government support under Grant Number DMR-9871996, awarded by NSF. The government has certain rights in the invention.

BACKGROUND

The invention relates to fluorescent emitting materials, and more particularly to fluorescent emitting materials having narrow linewidth emission characteristics.

Fluorescent emitters capable of emitting narrow linewidth radiation have an emission profile that includes emission having a full width at half maximum (FWHM) of less than about 75 nm. Narrow linewidth, fluorescent emitters are sought after for applications in multi-color devices such as light emitting color displays, optical and spectral encoding of information, biotagging and multiplexing. Fluorescent emitters, such as fluorescent dyes, although very bright (quantum yields from 70-100%), typically have large (40-100 nm) linewidths, which limits their use.

SUMMARY

In general, the method and apparatus of this invention provides narrow linewidth fluorescent emitters by incorporating a chromophore in a microcavity that supports low-order optical modes. When irradiated, the microcavity confines light emitted by the chromophore such that only a narrow linewidth of fluorescence resonates within the microcavity. The resonant emission has a Q-factor of 60-100. The resonant emission can have a FWHM of less than about 20 nm (e.g., less than about 10 nm). A distributed Bragg reflector (DBR) surrounds the chromophore and forms the microcavity that confines light within the core. A DBR can have periodic variations in the dielectric constant, such as layers of materials having alternating high and low indices of refraction. The structure of the DBR creates a photonic band gap over a range of energies at which the DBR acts as a total reflector. The range of energies over which the DBR creates in a photonic band gap depends upon the contrast in the indices of refraction and the periodicity of the DBR. A microcavity can be formed by selecting the DBR to reflect certain energies having a core diameter of a specific length to support or to be in resonance with an optical mode emitted by the chromophore that also occurs at an energy in the photonic band gap region.

The microcavity structure supports a single low order optical mode within the linewidth of the emitter in the sphere. The wavefunctions of photons in these low order modes look like those of electrons in atoms and are known as photon atoms. The linewidth of the low order optical mode will be significantly narrower than the normal emission linewidth from a fluorescing chromophore. The chromophore can be a fluorescent chromophore or a phosphorescent chromophore. Sol-gel chemistry can be used to incorporate chromophores such as dye molecules or semiconductor nanoparticles into the core and to construct the surrounding DBR mirrors.

In one aspect, a fluorescent emitter includes a core including a chromophore defining an emission profile, and a plurality of dielectric layers surrounding the core. Each layer having a thickness and a refractive index such that the plurality of dielectric layers causes at least a portion of the emission profile to narrow upon passing through the plurality of dielectric layers.

In another aspect, a photonic structure includes a core which in isolation defines a density of states for allowed modes of electromagnetic radiation, and a plurality of dielectric layers surrounding the core. Each layer having a thickness and refractive index such that the plurality of dielectric layers causes the density of states to narrow.

In another aspect, a photonic superstructure includes a plurality of photonic structures. Each photonic structure includes a core which in isolation defines a density of states for allowed modes of electromagnetic radiation, and a plurality of dielectric layers surrounding the core. Each layer has a thickness and refractive index such that the plurality of dielectric layers causes the density of states to narrow. The photonic structures are sufficiently close to one another to couple their allowed modes of electromagnetic radiation. The superstructure can be a self-assembly of the plurality of photonic structures. The superstructure can a substrate that supports an assembly of the plurality of photonic structures. The substrate can be patterned.

In another aspect, a light emitting display includes a plurality of narrow-linewidth, fluorescent emitters. Each emitter includes a core including a chromophore defining an emission profile, and a plurality of dielectric layers surrounding the core each layer having a thickness and a refractive index such that the plurality of dielectric layers causes at least a portion of the emission profile to narrow upon passing through the plurality of the dielectric layers.

In yet another aspect, a laser includes a gain medium including a plurality of narrow-linewidth, fluorescent emitters, a pumping source arranged to excite a population inversion in the gain medium, and an optical cavity surrounding the gain medium. Each emitter includes a core including a chromophore defining an emission profile and a plurality of dielectric layers surrounding the core each layer having a thickness and a refractive index such that the plurality of dielectric layers causes at least a portion of the emission profile to narrow upon passing through the plurality of the dielectric layers.

In another aspect, a method of making a photonic structure includes providing a core defining a density of states for allowed modes of electromagnetic radiation, and surrounding the core with a plurality of dielectric layers capable of narrowing at least a portion of the density of states. Surrounding the core can include depositing a first layer on the core having a first refractive index followed by depositing a second layer having a second refractive index greater than the second refractive index. The method can include doping the core with a chromophore.

The core can include at least one chromophore defining an emission profile. The chromophore can include a semiconducting nanoparticle, a dye molecule, or an inorganic phosphor. The chromophore can define an absorption profile in which electromagnetic radiation sufficient to be absorbed by a portion of the absorption profile can be transmitted through the plurality of dielectric layers.

The core can be substantially spherical. The core can include silica or a polymer. The core and the plurality of dielectric layers can define at least one resonant cavity having a Q factor greater than 40, or greater than 100, for at least one selected wavelength. The core can include a nonlinear optical material which in response to an optical excitation sufficiently changes its refractive index to prevent the narrowing of the density of states by the plurality of dielectric layers.

The plurality of dielectric layers can cause at least a portion of the emission profile to narrow upon passing through the plurality of layers. A metallic layer can surround the plurality of dielectric layers. One or more additional dielectric layers can surround the metallic layer. The refractive index of a first layer of the plurality can be greater than the refractive index of a second layer of the plurality, which can be adjacent to the first layer. The first layer can include a transition metal oxide and an inorganic sulfide. The second layer can include silica. In certain circumstances, the first layer and the second layer can alternate through the plurality of layers. The plurality of dielectric layers can include a bilayer, the bilayer having a first layer having a refractive index greater than the refractive index of a second layer. In certain circumstances, the plurality of dielectric layers can include a plurality of bilayers.

The microcavities can provide emission linewidths at FWHM of less than 10 nm. Unlike other microcavities utilizing whispering gallery modes (WGM) that support multiple modes, e.g., greater than 15 modes, at large cavity sizes (5-10 μm in diameter) and no supported modes at smaller sizes, the microcavities can be constructed to support a single optical mode. Microcavities can be excited by an excitation wavelength to the blue of the DBR photonic band gap (or to the red if exciting using a multiphoton process) such that the excitation wavelength passes through the DBR into the core to excite the chromophore. Due to the microcavity structure, i.e., DBR photonic band gap and cavity length, fluorescence from the chromophore is trapped inside the cavity in a single mode.

Other features or advantages will be apparent from the following detailed description of several embodiments, and also from the appended claims.

DETAILED DESCRIPTION

Figure 1:
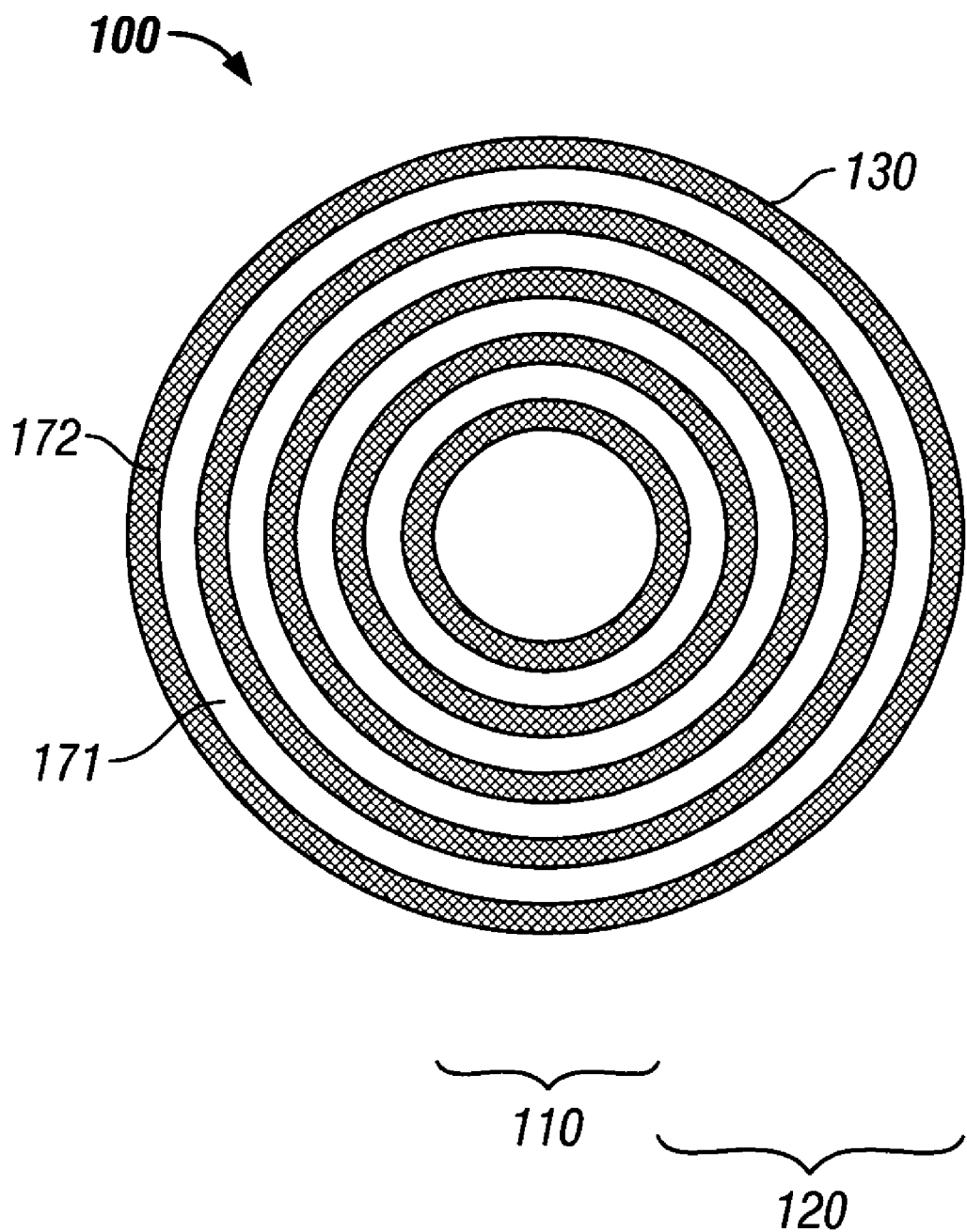
FIG. 1 is a drawing depicting a narrow linewidth emitter.
Figure 3:
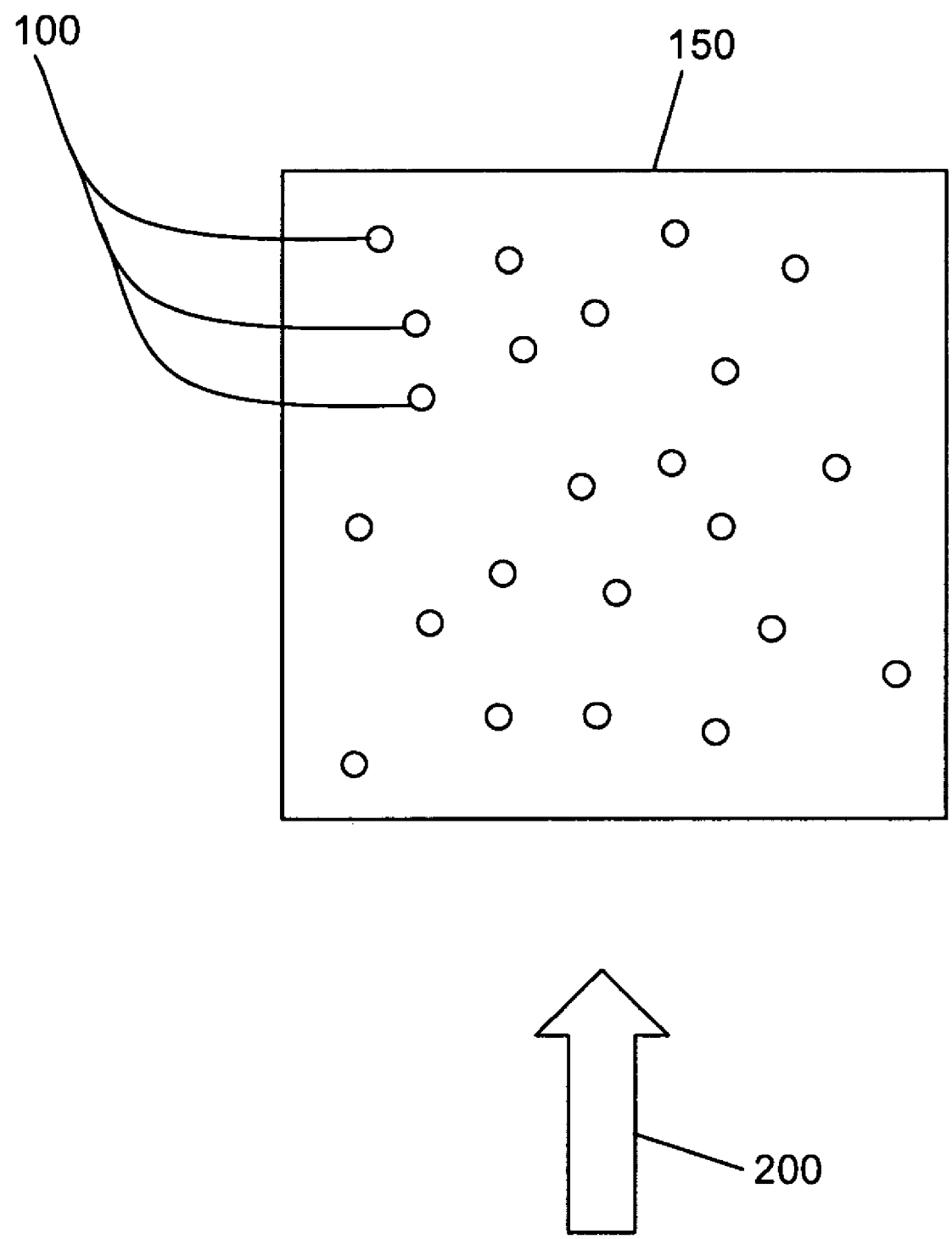
FIG. 3 is a drawing depicting an array of narrow linewidth emitters and a pumping source.

Referring to FIG. 1, a narrow linewidth emitter 100 includes a core 110 encapsulated by a DBR 120. Core 110 can be made entirely from, can be made partially from or can be doped with a chromophoric material. A microcavity 130 is formed between the DBRs to support a single optical mode. In general, the exact energy at which the microcavity supports the single optical mode depends upon the design of the DBRs, e.g., the location of the PBG region, and the geometry of the core. Typically, the DBR is designed so that the PBG region occurs at energies coincident with the fluorescence of the chromophore. The core has a diameter of about 1 micron or less and is an integral number of approximately $\lambda/2n_{core}$, where $\lambda$ is a desired emission wavelength supported by the single optical mode and $n_{core}$ is the index of refraction of the core. The narrow linewidth emitter design results in microspheres that support a single low order optical mode within the linewidth of the fluorescence emitted by the chromophore. The wavefunctions of the photons in the low order mode looks like those of electrons in atoms. For instance, the spherical microcavity of FIG. 1 supports s-type wavefunctions. Other types of low order modes can be produced by arranging multiple cores inside the DBRs, such as, for example, a dumbbell-shaped microcavity for supporting p-type wavefunctions. With reference to FIG. 3, the spheres can be processed to form trimers and other 3-dimensional arrays 150 of spheres 100 which can posses properties that are similar to photonic molecules and crystals. A pumping source 200 can be arranged to excite a population inversion in a gain medium that includes the array. Photonic crystals are described, for example, by J. D. Joannopoulos in *Photonic Crystals*, (Princeton University Press, Princeton, 1995), the entire contents of which are incorporated herein by reference.

Each DBR consists of a plurality bilayers 171 and 172. Each pair includes a layer having an index of refraction which is higher, $n_H$, than the index of refraction of another layer of the pair, $n_L$. The thickness of each of layers 171 and 172 are on the order of an optical wavelength and are, typically, equal to $\lambda/4n_H$ and $\lambda/4n_L$, where $n_H$ and $n_L$ are the indices of refraction of layers 171 and 172, respectively. The relative order of layer 171 and 172 depends upon the index of refraction of the core, $n_{Core}$. If $n_{Core}$ is higher than $n_H$, then the DBR layer having the lower index of refraction, $n_L$, is disposed adjacent to the core. If $n_{Core}$ is lower than $n_H$, then the DBR layer having the higher index of refraction, $n_H$, is disposed adjacent to the core. The total number of pairs of layers depends upon the desired reflectivity of the DBRs. For example, the DBR can include 2 to 22 pairs of quarter-wave bilayers. The reflectivity of the DBR reflectors is proportional to $$R_{2N} = \left( \frac{1 - \frac{n_{out}}{n_{in}}\left(\frac{n_L}{n_H}\right)^2}{1 + \frac{n_{out}}{n_{in}}\left(\frac{n_L}{n_H}\right)^2} \right)^2$$

where R is the reflectivity, $n_{out}$ is the outside refractive index (of air or solvent), n in is the inside refractive index (of the core), $n_L$ is the lower refractive index (of the dielectric mirror), and $n_H$ is the higher refractive index (of the dielectric mirror). Typically, a relative index of refraction contrast of 2.0/1.35 provides for a reflectivity of approximately 80% when 4 layers are deposited and leads to a 5-fold enhancement of the cavity Q-factor, $Q \propto \tau$, where $\tau$ is the cavity dwell time of the photon, and $$\tau \propto \frac{1}{1-R},$$

where R is the reflectivity of the mirror in a linear dielectric stack. For example, a reflectivity of 80 (R=0.8) leads to an enhancement of the Q factor by a factor of 5. Such refractive indices are accessible using semiconductor materials. In particular, a semiconductor like zinc selenide has a bulk refractive index of about 2.7 (mean value between 440 and 830 nm) and silica has a bulk refractive index of about 1.35.

DBRs typically include pairs of layered materials in which each layer of the pair has a different refractive index. Examples of materials for these layers include, but are not limited to, semiconductors, conductive oxides, glasses, and glass-like oxides. Examples of semiconductors can include Si, Ge, GaAs, GaP, InP, GaInAs, GaInPAs, ZnS, or ZnSe. Conductive oxides can include cadmium tin oxide (CTO) and indium tin oxide (ITO). Examples of glasses include $SiO_2$, phosphosilicates, borosilicates and borophosphosilicates, boroaluminum silicates, germanates, tellurites and fluorides, and glass-like oxides such as $Al_2O_3$ and $TiO_2$.

The core can be a material such as a polymer or glass containing the chromophoric material. Alternatively, the entire core can be a chromophoric material.

The chromophoric material can be any material compatible with the other components of the emitter and capable of emitting fluorescence in response to an external stimulus, such as optical irradiation or an electric field. Examples of chromophoric materials include, but are not limited to, dye molecules and semiconductor nanoparticles. Examples of dye molecules include (coumarins and rhodamines). Examples of semiconductor nanoparticles include, but are not limited to, elements from groups II-VI, III-V, and IV of the periodic table. Elements from these groups include, but are not limited to, CdS, CdSe, CdTe, ZnS, ZnSe, ZnTe, MgTe, GaAs, GaP, GaSb, GaN, HgS, HgSe, HgTe, InAs, InP, InSb, InN, AlAs, AlP, AlSb, AlS, PbS, PbSe, Ge, Si, or an alloy or mixture thereof, including ternary and quaternary mixtures. The semiconductor nanoparticles can be semiconductor nanocrystals. The nanocrystals can be illuminated with a light source at an absorption wavelength to cause an emission at an emission wavelength. The emission has a frequency that corresponds to the band gap of the quantum confined semiconductor material. The band gap is a function of the size of the nanocrystal. Nanocrystals having small diameters can have properties intermediate between molecular and bulk forms of matter. For example, nanocrystals based on semiconductor materials having small diameters can exhibit quantum confinement of both the electron and hole in all three dimensions, which leads to an increase in the effective band gap of the material with decreasing crystallite size. Consequently, both the optical absorption and emission of nanocrystals shift to the blue (i.e., to higher energies) as the size of the crystallites decreases.

The emission from the nanocrystal can be a narrow Gaussian emission band that can be tuned through the complete wavelength range of the ultraviolet, visible, or infrared regions of the spectrum by varying the size of the nanocrystal, the composition of the nanocrystal, or both. For example, CdSe can be tuned in the visible region and InAs can be tuned in the infrared region. Spectral emissions of the nanocrystals without the microcavity can be observed in a narrow range of about 75 nm, preferably 60 nm, more preferably 40 nm, and most preferably 30 nm full width at half max (FWHM). Spectral emissions of the nanocrystals encapsulated within a DBR to form a microcavity can be observed in a narrow range of about 20 nm, preferably about 15 nm, more preferably 10 nm, and most preferably about 10 nm or less full width at half max (FWHM). Semiconductor nanocrystals can have high emission quantum efficiencies such as greater than 10%, 20%, 30%, 40%, 50%, 60%, 70%, or 80%.

The semiconductor forming the nanocrystals can include a Group II-VI compound, a Group II-V compound, a Group III-VI compound, a Group III-V compound, a Group IV-VI compound, a Group I-III-VI compound, a Group II-IV-VI compound, or a Group II-IV-V compound, for example, ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TIN, TIP, TlAs, TlSb, PbS, PbSe, PbTe, or mixtures thereof.

Methods of preparing semiconductor nanocrystals include pyrolysis of organometallic reagents, such as dimethyl cadmium, injected into a hot, coordinating solvent. This permits discrete nucleation and results in the controlled growth of macroscopic quantities of nanocrystals. Preparation and manipulation of nanocrystals are described, for example, in U.S. application Ser. No. 08/969,302, incorporated herein by reference in its entirety. The method of manufacturing a nanocrystal is a colloidal growth process. Colloidal growth occurs by rapidly injecting an M donor and an X donor into a hot coordinating solvent. The injection produces a nucleus that can be grown in a controlled manner to form a nanocrystal. The reaction mixture can be gently heated to grow and anneal the nanocrystal. Both the average size and the size distribution of the nanocrystals in a sample are dependent on the growth temperature. The growth temperature necessary to maintain steady growth increases with increasing average crystal size. The nanocrystal is a member of a population of nanocrystals. As a result of the discrete nucleation and controlled growth, the population of nanocrystals obtained has a narrow, monodisperse distribution of diameters. The monodisperse distribution of diameters can also be referred to as a size. The process of controlled growth and annealing of the nanocrystals in the coordinating solvent that follows nucleation can also result in uniform surface derivatization and regular core structures. As the size distribution sharpens, the temperature can be raised to maintain steady growth. By adding more M donor or X donor, the growth period can be shortened.

The M donor can be an inorganic compound, an organometallic compound, or elemental metal. M is cadmium, zinc, magnesium, mercury, aluminum, gallium, indium or thallium. The X donor is a compound capable of reacting with the M donor to form a material with the general formula MX. Typically, the X donor is a chalcogenide donor or a pnictide donor, such as a phosphine chalcogenide, a bis (silyl) chalcogenide, dioxygen, an ammonium salt, or a tris(silyl) pnictide. Suitable X donors include dioxygen, bis(trimethylsilyl) selenide (($TMS)_2Se$), trialkyl phosphine selenides such as (tri-n-octylphosphine) selenide (TOPSe) or (tri-n-butylphosphine) selenide (TBPSe), trialkyl phosphine tellurides such as (tri-n-octylphosphine) telluride (TOPTe) or hexapropylphosphorustriamide telluride (HPPTTe), bis(trimethylsilyl)telluride (($TMS)_2Te$), bis(trimethylsilyl)sulfide (($TMS)_2S$), a trialkyl phosphine sulfide such as (tri-n-octylphosphine) sulfide (TOPS), an ammonium salt such as an ammonium halide (e.g., $NH_4Cl$), tris(trimethylsilyl) phosphide (($TMS)_3P$), tris(trimethylsilyl) arsenide (($TMS)_3As$), or tris(trimethylsilyl) antimonide (($TMS)_3Sb$). In certain embodiments, the M donor and the X donor can be moieties within the same molecule.

The presence of a coordinating ligand, which can be a solvent or can be included in the solvent, can help control the growth of the nanocrystal. The coordinating ligand is an agent that serves as a growth inhibitor or stabilizer. The coordinating ligand is a compound having a donor lone pair that, for example, has a lone electron pair available to coordinate to a surface of the growing nanocrystal. Ligand coordination can stabilize the growing nanocrystal. Typical coordinating ligands include alkyl phosphines, alkyl phosphine oxides, alkyl phosphonic acids, or alkyl phosphinic acids, however, other coordinating ligands, such as pyridines, furans, and amines may also be suitable for the nanocrystal production. Examples of suitable coordinating ligands include pyridine, tri-n-octyl phosphine (TOP) and tri-n-octyl phosphine oxide (TOPO). Technical grade TOPO can be used.

Size distribution during the growth stage of the reaction can be estimated by monitoring the absorption line widths of the particles. Modification of the reaction temperature in response to changes in the absorption spectrum of the particles allows the maintenance of a sharp particle size distribution during growth. Reactants can be added to the nucleation solution during crystal growth to grow larger crystals. By stopping growth at a particular nanocrystal average diameter and choosing the proper composition of the semiconductor material, the emission spectra of the nanocrystals can be tuned continuously over the wavelength range of 400 nm to 800 nm. The nanocrystal has a diameter of less than 150 Å. A population of nanocrystals has average diameters in the range of 15 Å to 125 Å.

The nanocrystal can be a member of a population of nanocrystals having a narrow size distribution. The nanocrystal can be a sphere, rod, disk, or other shape. The nanocrystal can include a core of a semiconductor material. The nanocrystal can include a core having the formula MX, where M is cadmium, zinc, magnesium, mercury, aluminum, gallium, indium, thallium, or mixtures thereof, and X is oxygen, sulfur, selenium, tellurium, nitrogen, phosphorus, arsenic, antimony, or mixtures thereof.

The core can have an overcoating on a surface of the core. The overcoating can be a semiconductor material having a composition different from the composition of the core. The overcoat of a semiconductor material on a surface of the nanocrystal can include a Group II-VI compound, a Group II-V compound, a Group III-VI compound, a Group III-V compound, a Group IV-VI compound, a Group I-III-VI compound, a Group II-IV-VI compound, or a Group II-IV-V compound, for example, ZnS, ZnO, ZnSe, ZnTe, CdS, CdO, CdSe, CdTe, MgS, MgSe, HgO, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe, PbTe, $SiO_2$, or mixtures thereof. For example, ZnS, ZnSe or CdS overcoatings can be grown on CdSe or CdTe nanocrystals. An overcoating process is described, for example, in U.S. application Ser. No. 08/969,302, incorporated herein by reference in its entirety. By adjusting the temperature of the reaction mixture during overcoating and monitoring the absorption spectrum of the core, over coated materials having high emission quantum efficiencies and narrow size distributions can be obtained.

The particle size distribution can be further refined by size selective precipitation with a poor solvent for the nanocrystals, such as methanol/butanol as described in U.S. application Ser. No. 08/969,302, incorporated herein by reference. For example, nanocrystals can be dispersed in a solution of 10% butanol in hexane. Methanol can be added dropwise to this stirring solution until opalescence persists. Separation of supernatant and flocculate by centrifugation produces a precipitate enriched with the largest crystallites in the sample. This procedure can be repeated until no further sharpening of the optical absorption spectrum is noted. Size-selective precipitation can be carried out in a variety of solvent/nonsolvent pairs, including pyridine/hexane and chloroform/methanol. The size-selected nanocrystal population can have no more than a 15% rms deviation from mean diameter, preferably 10% rms deviation or less, and more preferably 5% rms deviation or less.

The outer surface of the nanocrystal can include a layer of compounds derived from the coordinating ligand used during the growth process. The surface can be modified by repeated exposure to an excess of a competing coordinating group to form an overlayer. For example, a dispersion of the capped nanocrystal can be treated with a coordinating organic compound, such as pyridine, to produce crystallites which disperse readily in pyridine, methanol, and aromatics but no longer disperse in aliphatic solvents. Such a surface exchange process can be carried out with any compound capable of coordinating to or bonding with the outer surface of the nanocrystal, including, for example, phosphines, thiols, amines and phosphates. The nanocrystal can be exposed to short chain polymers which exhibit an affinity for the surface and which terminate in a moiety having an affinity for a suspension or dispersion medium. Such affinity improves the stability of the suspension and discourages flocculation of the nanocrystal.

Transmission electron microscopy (TEM) can provide information about the size, shape, and distribution of the nanocrystal population. Powder x-ray diffraction (XRD) patterns can provided the most complete information regarding the type and quality of the crystal structure of the nanocrystals. Estimates of size are also possible since particle diameter is inversely related, via the X-ray coherence length, to the peak width. For example, the diameter of the nanocrystal can be measured directly by transmission electron microscopy or estimated from x-ray diffraction data using, for example, the Scherrer equation. It also can be estimated from the UV/Vis absorption spectrum.

Silica ($SiO_2$) spheres have been synthesized with good size control from tetraethoxysilane (TEOS). See, for example, Stöber et al., *Journal of Colloid Interface Science*, 26:62-69 (1968) and Bogush, *Journal of Noncrystalline Solids*, 104:95 (1988). These spheres are amenable to core-shell type, seeded growth techniques, in which the size of the spheres is increased by adding more silica precursor to the original spheres in a controlled growth solvent. Such spheres have also been effectively modified with dye molecules by Vrij et al., *Langmuir*, 8:2921 (1992), who demonstrated that these dye molecules could be placed into well-defined shells within the silica sphere. Following methods described by Marzan et al., *Langmuir*, 12:4329 (1996). Mulvaney et al. describe methods by which gold and silver nanoparticles have been sequestered in the core of silica spheres. Semiconductor nanocrystals can be incorporated into the center of such spheres by modifying the methods of Mulvaney et al. Here, the surface of the nanoparticles is treated with a silica coupling reagent, such as, for example, aminopropyltrimethoxysilane (APS) or mercaptopropyltrimethoxysilane (MPS). Controlled precipitation of silica is then effected by changing the pH of solutions containing these nanoparticles and silicate precursor solutions. Such spheres are small, for example, having diameters of 200 nm or less, and do not significantly modify the emission profile of the semiconductor nanoparticle stabilized in the sphere. No reduction in the emission linewidth of the nanocrystals is observed, when placed inside such spheres. However, control over the size of the spheres is high (standard deviation less than 10%), which provides a uniform base on which to construct the DBRs. Once encapsulated in the DBRs to form the microcavity, the linewidth reduces. Because the spheres are too small to support whispering gallery modes, the location of the nanocrystals in the sphere is not critical.

Chemical modification of the surface of these nanocrystals makes them amenable to incorporation in a shell around the luminescent silica spheres. Specifically, replacing the original cap with an amino-terminated silane-coupling agent enables the nanocrystals to be cross-linked in much the same fashion as the original TEOS precursor. Also, varying the length of the alkyl chain allows ZnSe nanocrystals to be evenly dispersed into the new cap. Such uniformity in dispersion is necessary for controlled deposition of these nanocrystals onto the template silica microsphere.

Figure 2A:
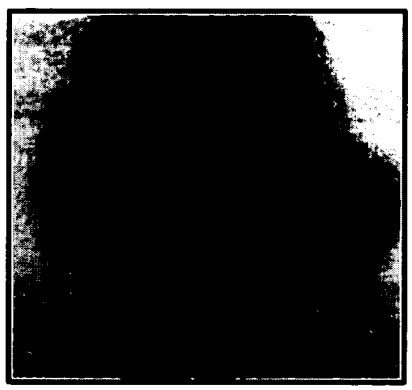
FIGS. 2A-C are a scanning transmission electron microscope images of an emitter.
Figure 2B:
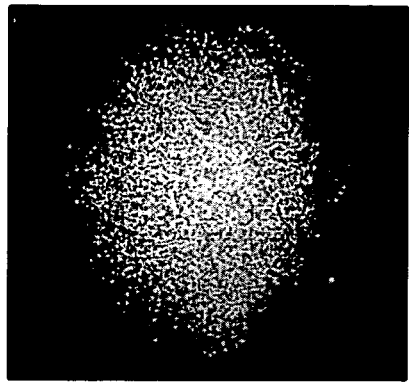
Figure 2C:
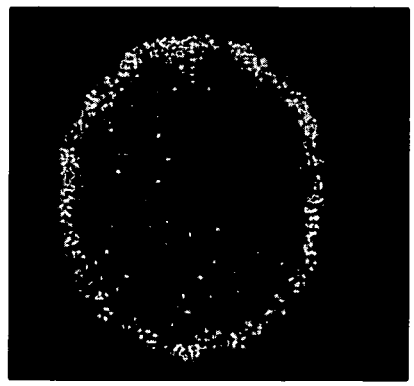

Referring to FIGS. 2A-C, a series of scanning transmission electron microscope (STEM) images examining an attempt at sequential deposition of CdSe nanocrystals onto a silica sphere reveals that control over the location of the Cd is evident from the ring pattern seen with exclusion of silica from the Cd region. FIG. 2A is a composite image, FIG. 2B is a Si map and FIG. 2C is a Cd map. The surface morphology, however, is not uniform on account of the CdSe nanocrystals serving as sites of secondary nucleation. Secondary nucleation events can be reduced via a reduction in the concentration of TEOS present in the solution while crosslinking the nanocrystals. Layer thickness and location is controlled by varying the relative proportions of precursors introduced in the core and shell stages of growth.

Another proposed route to building the DBR includes using titanium or zirconium analogues of TEOS. These materials crosslink in a manner similar to TEOS and have been successfully adapted for sol-gel processes to yield composite silica-titania materials. Amorphous $TiO_2$ has been adapted to produce alternating layers of silica and titania on silica or iron particles.

The active region (the resonant cavity) need not be the core, but could also be one or more shells. By combining a core and shells as active regions it is possible to make a resonator that has multiple resonances that are independently tuned for greater flexibility. The structure need not be spherical, but it could be elongated or box-like. The only requirement is that its dimensions and shape can support a distinct low order optical mode. The DBR layers or core layers can also be made of a thin metal, such as silver. For example, a thin final shell of silver may increase the Q of the cavity without needing to further increase the size of the system. Thin metal shells may also be interspersed with the dielectric shells for a similar effect. The dimensions need not be those corresponding to visible light. The microcavity can be constructed to support a low optical mode in the near UV, near IR and IR wavelengths.

The narrow linewidth emitters can be used in a number of applications. In light emitting displays the reduction of chromophore linewidth will be directly useful for the formation of multicolor displays. As these microcavities are constructed in organic polar solvents, they can be easily processed and used in light emitting displays. Furthermore, the reduction in the emission linewidth will enable the formation of a completely saturated color palette. In laser cavities, the narrow linewidth emitters not only provide an efficient feedback mechanism for enhancing stimulated emission but also they are inherently single mode. Thus, the narrow linewidth emitters reduce the stimulated emission thresholds of laser cavities including the encapsulated chromophores. In optical barcodes, the narrow emission linewidths allows the narrow linewidth emitters to form complex optical signatures by combining different "colored" spheres. The cavities themselves can be lasers, such as microlasers. Use of nanocrystals in these structures enables simultaneous excitation of all colored spheres. In optical switches, by modulating the refractive index of the core (by doping it with a non-linear optical material which is then optically modulate for example of by applying an electric field to the DBR), it is possible to shift the cavity out of resonance and hence reduce the emission from the sphere. This could be used to turn a lasing cavity on or off. In photon molecules, solids, and photonic crystals, the narrow linewidth emitters, i.e., photon atoms, can serve as building blocks for molecular and supermolecular structures. Photonic crystals can also be formed from these structures, where a 3-dimensional bandgap arises from the interaction between the EM fields of the constituent photon atoms. The width of the band gap is tuned by modulating the coupling the between the photon atoms (by varying the intersphere distance for example). In passive optical microcavities, the narrow linewidth emitters by themselves, in the absence of internal chromophores, can also have applications as passive optical components with the same set of properties as above, with the light field coming from an external beam that interacts with the structures through scattering. The intensity and directionality of the scattering will be strongly wavelength dependent in the spectral region corresponding to the mode of the cavity, thereby modify the incoming light beam. The narrow linewidth emitters can also be used to detect distances between other narrow linewidth emitters. For example, two narrow linewidth emitters can be attached to unfolded DNA at different sites. In a coiled or folded configuration, the DNA may bring the two narrow linewidth emitters into proximity of each other. In close proximity, the two narrow linewidth emitters may couple such that the emission lines from each emitter shifts to a different energy. The distance between the two emitters can be determined by monitoring the shift in emission energy.

EXAMPLES

An emitter can be constructed with a DBR including high refractive index media (n=2.2, titania) and low refractive index media (n=1.46, silica). The core radius was about 0.18 µm. The DBRs includes 4 pairs of layers of the high and low refractive indices. The high refractive index layer had a thickness of about 0.07 µm and the low refractive index layer had a thickness of about 0.11 µm.

The emitter exhibited emission at about 600 nm with a 30 nm full width at half maximum.

Silica sphere synthesis (control for the core) was done following the Stober process using a two step procedure to focus the size distribution. More specifically, the general synthetic scheme for silica spheres follows the procedure described in Bogush et al. For example, 1.0 mL of deionized water and 0.35 mL of concentrated ammonium hydroxide were added to 10 mL of anhydrous ethanol. The mixture was homogenized under rapid stirring and thereafter 0.45 mL of tetraethylorthosilicate (TEOS) was added. After stirring for approximately two hours, another 1.8 mL of deionized water and 0.9 mL of TEOS were added. This solution was then allowed to stir for at least another 3 hours at room temperature. The standard deviation obtained was σ<5%.

Fluorophore incorporation was done by extending a procedure developed by Vrij and Van Blaaderen to incorporate Rhodamine B dye into silica spheres. Briefly, 1.2 mg of rhodamine isocyanate was reacted with 0.1 g of aminopropyltrimethoxysilane (APS) in approximately 2 mL of absolute ethanol. The resulting highly fluorescent solution was added either along with the TEOS (as described above) to form core-doped silica spheres, or was added to preexisting cores synthesized to yield core-shell structures with the dye localized in the shell Semiconductor nanocrystals were incorporated into silica spheres by modifying the nanocrystal surfaces from their native phosphine/phosphine oxide cap to contain a silane coupling agent. Then, analogous to the method above for dye incorporation, the nanocrystals were introduced along with the silica precursors to force their incorporation into the growing silica spheres. More specifically, nanocrystal surfaces were modified by replacing the native, as-synthesized phosphine/phosphine oxide surface with an amine based coupling reagent. To approximately 400 mg of purified CdSe nanoparticles (with a minimum amount of TOP/TOPO), 500 mg of APS were added in an inert atmosphere glove box. The resulting slurry was stirred at 60° C. for two hours and then another 2.0 g of TEOS were added to yield a clear solution. This solution was then added either to neat TEOS in anhydrous ethanol, de-ionized water and ammonium hydroxide solution to yield core doped silica spheres or to preexisting silica cores to yield core-shell structures in which the nanocrystals are localized in the shell.

Nanocrystal surfaces were modified by replacing the TOP/TOPO cap with tris hydroxylpropyl phosphine to render the nanocrystals soluble in ethanol. Thereafter, these modified nanocrystals were treated with a sol-gel titania precursor (titanium (IV) butoxide, although others could be used), and allowed to form a slightly viscous prepolymer solution by stirring under an inert atmosphere at 60° C. for at least two hours. Such modification allows for the incorporation of nanocrystals as a shell on top of preexisting silica spheres.

The DBRs are formed by alternating layers of silica and ZnSe or titania. Silica can provide the lower refractive index (1.46) and can be grown directly using the silica precursors used above. Successful growth was confirmed using scanning transmission electron microscopy (STEM) in the element map mode. Silica shells can be grown using TEOS as the silicon source. Briefly, spheres with nanocrystals either on the surfaces of the spheres or in the cores of the spheres are diluted in ethanol with ammonium hydroxide and water. Thereafter, TEOS is added slowly so as to minimize new silica sphere nucleation.

High Refractive Index Layer:

A. Zinc selenide (ZnSe) nanocrystals were synthesized following literature methods and subsequently cap-exchanged with the amino-silyl coupling agent. As described above, these nanoparticles can be incorporated into a shell along with the silane precursor. Zinc selenide nanocrystals can be utilized as a high refractive index shell using a procedure similar to that used to incorporate CdSe nanocrystals in silica spheres.

B. Titania ($TiO_2$) layers can be grown on top of silica spheres using a procedure adapted from Hanprasopwattana et al., *Langmuir*, 12:3173 (1996). For example, silica spheres, synthesized as described above, are dispersed in 10 mL anhydrous ethanol by sonication and rapid stirring. The solution is placed in an oil bath at 60° C. along with 0.2 mL of deionized water. Thereafter, 5 mL of anhydrous ethanol with 0.1 m: of titanium (IV) butoxide are injected into this solution and stirred for two hours at 60° C. Thicker shells of titania were created by multiple injections of the titania precursor. The thickness of the shells was altered by changing the concentration of spheres being coated relative to the concentration of precursors. For example, lower concentration of spheres produced thicker shells.

What is claimed is:

1. A fluorescent emitter comprising:
   a core including a chromophore defining an emission profile; and
   a plurality of dielectric layers surrounding the core, each layer having a thickness and a refractive index such that the plurality of dielectric layers causes at least a portion of the emission profile to narrow upon passing through the plurality of dielectric layers.

2. A photonic structure comprising:
   a core which in isolation defines a density of states for allowed modes of electromagnetic radiation, and includes at least one chromophore defining an emission profile; and
   a plurality of dielectric layers surrounding the core, each layer having a thickness and refractive index such that the plurality of dielectric layers causes the density of states to narrow.

3. The structure of claim 2, wherein the plurality of dielectric layers causes at least a portion of the emission profile to narrow upon passing through the plurality of layers.

4. The structure of claim 2, wherein the chromophore comprises a semiconducting nanoparticle.

5. The structure of claim 2, wherein the chromophore comprises a dye molecule.

6. The structure of claim 2, wherein the chromophore comprises an inorganic phosphor.

7. The structure of claim 2, wherein the core is substantially spherical.

8. The structure of claim 7, wherein the core comprises silica.

9. The structure of claim 7, wherein the core comprises a polymer.

10. The structure of claim 2, further comprising a metallic layer surrounding the plurality of dielectric layers.

11. The structure of claim 10, further comprising one or more additional dielectric layers surrounding the metallic layer.

12. The structure of claim 2, wherein the refractive index of a first layer of the plurality is greater than the refractive index of a second layer of the plurality, the second layer being adjacent to the first layer.

13. The structure of claim 12, wherein the first layer comprises a transition metal oxide and an inorganic sulfide.

14. The structure of claim 12, wherein the second layer comprises silica.

15. The structure of claim 12, wherein the first layer and the second layer alternate through the plurality of layers.

16. The structure of claim 2, wherein the core and the plurality of dielectric layers define at least one resonant cavity having a Q factor greater than 40 for at least one selected wavelength.

17. The structure of claim 2, wherein the core and the plurality of dielectric layers define at least one resonant cavity having a Q factor greater than 100 for at least one selected wavelength.

18. The structure of claim 3, wherein the chromophore defines an absorption profile, and wherein electromagnetic radiation sufficient to be absorbed by a portion of the absorption profile can be transmitted through the plurality of dielectric layers.

19. The structure of claim 2, wherein the plurality of dielectric layers comprises a bilayer, the bilayer having a first layer having a refractive index greater than the refractive index of a second layer.

20. The structure of claim 19, wherein the plurality of dielectric layers comprises a plurality of bilayers.

21. The structure of claim 2, wherein the core comprises a nonlinear optical material which in response to an optical excitation sufficiently changes its refractive index to prevent the narrowing of the density of states by the plurality of dielectric layers.

22. A photonic superstructure comprising a plurality of photonic structures,
   wherein each photonic structure comprises
      a core which in isolation defines a density of states for allowed modes of electromagnetic radiation, and includes at least one chromophore defining an emission profile; and
      a plurality of dielectric layers surrounding the core, each layer having a thickness and refractive index such that the plurality of dielectric layers causes the density of states to narrow, and wherein the photonic structures are sufficiently close to one another to couple their allowed modes of electromagnetic radiation.

23. The photonic superstructure of claim 22, wherein the superstructure is a self-assembly of the plurality of photonic structures.

24. The photonic superstructure of claim 22, wherein the superstructure further comprises a substrate that supports an assembly of the plurality of photonic structures.

25. The photonic superstructure of claim 22, wherein the substrate is patterned.

26. A light emitting display comprising:
a narrow-linewidth, fluorescent emitter comprising
   a core including a chromophore defining an emission profile; and
   a plurality of dielectric layers surrounding the core each layer having a thickness and a refractive index such that the plurality of dielectric layers causes at least a portion of the emission profile to narrow upon passing through the plurality of the dielectric layers.

27. A laser comprising:
a gain medium comprising a narrow-linewidth, fluorescent emitter comprising
   a core including a chromophore defining an emission profile; and
   a plurality of dielectric layers surrounding the core each layer having a thickness and a refractive index such that the plurality of dielectric layers causes at least a portion of the emission profile to narrow upon passing through the plurality of the dielectric layers;
a pumping source arranged to excite a population inversion in the gain medium; and
an optical cavity surrounding the gain medium.

28. A method of making a photonic structure comprising:
providing a core defining a density of states for allowed modes of electromagnetic radiation and including at least one chromophore defining an emission profile, and
surrounding the core with a plurality of dielectric layers capable of narrowing at least a portion of the density of states.

29. The method of claim 28, wherein surrounding the core comprises depositing a first layer on the core having a first refractive index followed by depositing a second layer having a second refractive index greater than the first refractive index.

30. The method of claim 28, further comprising doping the core with a chromophore.

31. The emitter of claim 1, wherein the core is substantially spherical.

32. The photonic structure of claim 2, wherein the core is substantially spherical.

33. The light emitting display of claim 26, wherein the core is substantially spherical.

34. The laser of claim 27, wherein the core is substantially spherical.

35. The method of claim 28, wherein the core is substantially spherical.

* * * * *